(12) United States Patent
Kamijo (10) Patent No.: US 9,082,778 B2
(45) Date of Patent: Jul. 14, 2015

(54) SEMICONDUCTOR DEVICE AND MANUFACTURING METHOD OF SAME

(71) Applicant: Takuma Kamijo, Toyota (JP)

(72) Inventor: Takuma Kamijo, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 13/954,457

(22) Filed: Jul. 30, 2013

(65) Prior Publication Data

US 2014/0035124 A1 Feb. 6, 2014

(30) Foreign Application Priority Data

Aug. 2, 2012 (JP) ................... 2012-172211

(51) Int. Cl.
*H01L 21/00* (2006.01)
*H01L 23/00* (2006.01)
*H01L 23/31* (2006.01)

(52) U.S. Cl.
CPC .......... *H01L 23/562* (2013.01); *H01L 23/3192* (2013.01); *H01L 2924/0002* (2013.01)

(58) Field of Classification Search
CPC .............. H01L 23/0623; H01L 23/063; H01L 23/0634; H01L 23/562; H01L 23/319; H01L 29/7811; H01L 29/7823; H01L 23/3192
USPC .................................................. 438/618, 622
See application file for complete search history.

(56) References Cited

U.S. PATENT DOCUMENTS

| | | | | |
|---|---|---|---|---|
| 5,161,093 A | * | 11/1992 | Gorczyca et al. | 361/795 |
| 6,054,752 A | * | 4/2000 | Hara et al. | 257/629 |
| 6,133,144 A | * | 10/2000 | Tsai et al. | 438/634 |
| 2001/0043175 A1 | * | 11/2001 | Yasukawa | 345/87 |
| 2006/0246642 A1 | * | 11/2006 | Veeramma | 438/197 |
| 2007/0138596 A1 | | 6/2007 | Kitamura et al. | |
| 2007/0194348 A1 | * | 8/2007 | Yang et al. | 257/202 |

FOREIGN PATENT DOCUMENTS

| | | | |
|---|---|---|---|
| JP | A-1-200635 | | 8/1989 |
| JP | A-4-028231 | | 1/1992 |
| JP | A-4-316330 | | 11/1992 |
| JP | A-6-326201 | | 11/1994 |
| JP | A-11-8234 | | 1/1999 |
| JP | A-11-54497 | | 2/1999 |
| JP | A-2001-257210 | | 9/2001 |
| JP | A-2001-358153 | | 12/2001 |
| JP | A-2004-119415 | | 4/2004 |
| JP | A-2005-117067 | | 4/2005 |
| JP | A-2005-203548 | | 7/2005 |
| JP | 2010-161240 | * | 7/2010 |
| JP | A-2011-114008 | | 6/2011 |

OTHER PUBLICATIONS

Partial Translation of Jun. 17, 2014 Japanese Office Action issued in Japanese Patent Application No. 2012-172211.

* cited by examiner

*Primary Examiner* — Colleen A Matthews
*Assistant Examiner* — Quovaunda V Jefferson
(74) *Attorney, Agent, or Firm* — Oliff PLC (57) ABSTRACT

An semiconductor device includes a semiconductor substrate; a metal layer arranged above the semiconductor substrate; a first passivation film that contacts at least a portion of one side surface of the metal layer; and a second passivation film that is arranged extending from the first passivation film to the metal layer, and contacts an upper surface of the first passivation film, and contacts at least a portion of an upper surface of the metal layer.

6 Claims, 5 Drawing Sheets

RELATED ART

SEMICONDUCTOR DEVICE AND MANUFACTURING METHOD OF SAME

INCORPORATION BY REFERENCE

The disclosure of Japanese Patent Application No. 2012-172211 filed on Aug. 2, 2012 including the specification, drawings and abstract is incorporated herein by reference in its entirety.

BACKGROUND OF THE INVENTION

1. Field of the Invention

The invention relates to a semiconductor device and a manufacturing method thereof.

2. Description of Related Art

A semiconductor device is provided with a passivation film for protecting a semiconductor element. With a semiconductor device in which a metal layer (i.e., an electrode or wiring or the like) is formed on an insulating film, typically a passivation film is formed on the metal layer, and then an organic coating film (such as a polyimide) is formed, after which the device is packaged with resin or the like. In this case, a crack may form in the passivation film due to a change in the external temperature. That is, stress from the resin, the organic coating film, and the metal layer may cause stress to concentrate at a corner portion of the protruding metal layer, and a crack may form in the passivation film that covers this corner portion. Japanese Patent Application Publication No. 2011-114008 (SP 2011-114008 A) describes a semiconductor device that reduces the occurrence of cracking in the passivation film due to a change in temperature.

With the semiconductor device described in JP 2011-114008 A, aluminum wiring (i.e., a metal layer) is formed on a barrier layer (i.e., a passivation film), a cap metal (TiN or the like) is provided on an upper portion of this aluminum wiring, and a sidewall SiN or SiO or the like) is provided on a side portion of the aluminum wiring. Forming aluminum wiring above the barrier layer (i.e., the passivation film) enables the occurrence of cracking in the barrier layer (i.e., the passivation film) to be reduced.

With the semiconductor device described in JP 2011-114008 A, the area of the metal layer (i.e., the aluminum wiring) is surrounded by a film (hereinafter also referred to as a "coating") that has a smaller linear expansion coefficient than the metal layer. When such a structure is heated to a high temperature (for example, if a polyimide baking process is applied during manufacturing), the metal layer will greatly expand, while the coating around the metal layer will not greatly expand. Therefore, the metal layer will plastic deform inside the coating, and the crystal density of the metal layer will consequently increase. Then when the structure returns to annual temperature, the metal layer of which the crystal density had temporarily increased will become smaller than the metal layer before being heated. As a result, a cavity (hereinafter also referred to as a "void") that previously did not exist will end up being formed between the metal layer and the coating.

SUMMARY OF THE INVENTION

The invention thus provides a semiconductor device in which a void is inhibited from forming between a metal layer and a coating (i.e., a passivation film).

A first aspect of the invention relates to an semiconductor device that includes a semiconductor substrate; a metal layer arranged above the semiconductor substrate; a first passivation film that contacts at least a portion of one side surface of the metal layer; and a second passivation film that is arranged extending front the first passivation film to the metal layer, and contacts an upper surface of the first passivation film, and contacts at least a portion of an upper surface of the metal layer.

According to the structure of this first aspect, a void is able to be inhibited from forming.

A second aspect of the invention relates to a semiconductor device manufacturing method that includes forming a metal layer above a semiconductor substrate; forming a first passivation film that contacts at least a portion of one side surface of the metal layer; and forming a second passivation film that is formed extending from the first passivation film to the metal layer, and contacts an upper surface of the first passivation film, and contacts at least a portion of an upper surface of the metal layer.

According to this second aspect of the invention, the semiconductor device that is inhibited a void forming is able to be manufactured.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

In the semiconductor device of the invention, a linear expansion coefficient of a metal layer may be larger than a linear expansion coefficient of a second passivation film. Also, a linear expansion coefficient of a first passivation film may be larger than the linear expansion coefficient of the second passivation.

According to this structure, the metal layer contacts not only the second passivation film, but also the first passivation film that has a larger linear expansion coefficient than the second passivation film. Therefore, the metal layer is able to appropriately expand when heated, so an increase in the crystal density of the metal layer is able to be inhibited. As a result, a void is able to be inhibited from being formed.

In the semiconductor device of the invention, the first passivation film may include a polyimide.

The linear expansion coefficient of the polyimide is approximately $40 \times 10^{-6}$ [/K], so the metal layer is able to appropriately expand when heated. Therefore, a void is able to be inhibited from fuming when the metal layer returns to normal temperature.

In the semiconductor device of the invention, the second passivation film may be semiconductive.

According to this structure, even if movable ions enter the upper layer of the second passivation film, an induced charge is able to be inhibited from being produced in the surface of the semiconductor substrate by flowing current to the second passivation film.

In the semiconductor device of the invention, the second passivation film may be formed in a peripheral voltage-resistant region.

This structure makes it possible to appropriately inhibit movable ions from entering the semiconductor substrate (particularly a region having a RESURF structure).

Figure 1:
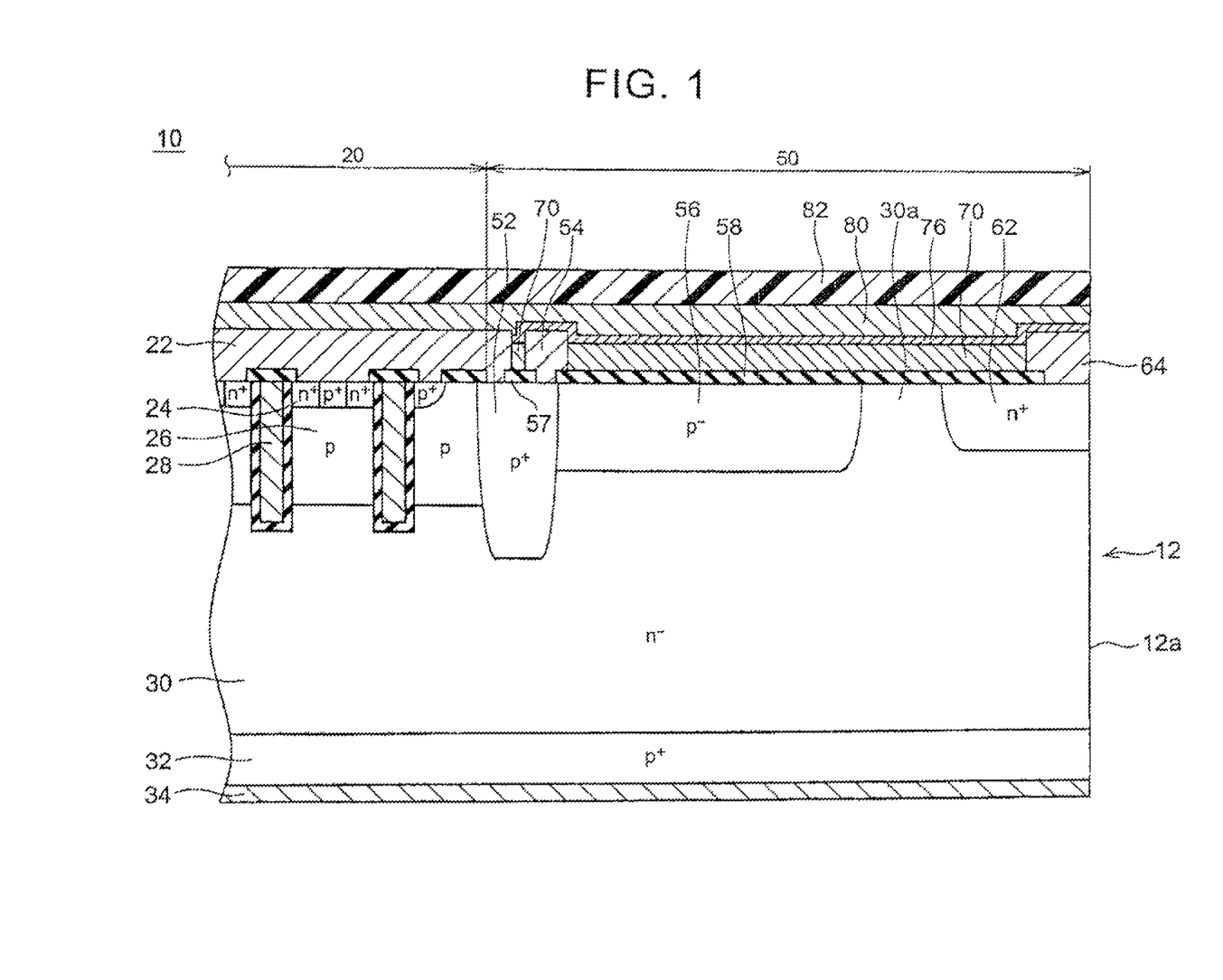
FIG. 1 is a longitudinal sectional view of a semiconductor device of the invention.

Next, example embodiments of the semiconductor device of the invention will be described. FIG. 1 is a longitudinal sectional view of a semiconductor device 10 of the invention. As shown in FIG. 1, the semiconductor device 10 includes a semiconductor substrate 12, and an electrode and an insulating film and the like formed on an upper surface and a lower surface of the semiconductor substrate 12. The semiconductor substrate 12 has air active region 20 and a peripheral voltage-resistant region 50. An IGBT (Insulated Gate Bipolar Transistor) is formed in the active region 20. The active region 20 is formed in substantially a center portion of the semiconductor substrate 12 when the semiconductor substrate 12 is viewed from the upper surface side. The peripheral voltage-resistant region 50 is a region that mitigates the electric field of the active region 20. The peripheral voltage-resistant region 50 is formed at an outer peripheral portion of the semiconductor substrate 12. More specifically, the peripheral voltage-resistant region 50 is a region that is between the active region 20 an outer end portion (i.e., an outer periphery) 12a of the semiconductor substrate 12. Therefore, when the semiconductor substrate 12 is viewed from above, the active region 20 is surrounded by the peripheral voltage-resistant region 50.

A trench is formed in an upper surface of the active region 20. The inner surface of the trench is covered by a gate insulating film. A gate electrode 28 is formed in the trench. An emitter electrode 22 is formed on the upper surface of the active region 20. A bus bar, not shown, is solder joined to the emitter electrode 22. A collector electrode 34 is formed on a lower surface of the semiconductor substrate 12. An electrode (for example, the emitter electrode 22, a gate electrode pad (i.e., a pad that is connected to each gate electrode 28), not shown, and another signal extracting electrode) on an upper surface of the semiconductor device 10 is connected to an external conductive member by a brazing filler metal such as solder, or wire bonding, or a conductive paste or the like.

An n-type emitter region 24, a p-type body region 26, an n-type drift region 30, and a p-type collector region 32 are formed in the active region 20. The emitter region 24 is formed in an area exposed on the upper surface of the semiconductor substrate 12. The emitter region 24 contacts a gate insulating film that covers the gate electrode 2. The emitter region 24 is ohmically connected to the emitter electrode 22. The body region 26 is formed next to the emitter region 24 and on the lower side of the emitter region 24. The body region 26 contacts the gate insulating film on the lower side of the emitter region 24. The body region 26 (a so-called body contact region) between two emitter regions 24 has a high p-type impurity concentrations and is ohmically connected to the emitter electrode 22. The drift region 30 is formed on a lower side of the body region 26. The drift region 30 is separated from the emitter region 24 by the body region 26. The drift region 30 contacts the gate insulating film of a lower end portion of the trench. The collector region 32 is formed on a lower side of the drift region 30. The collector region 32 has a high p-type impurity concentration, and is ohmically connected to the collector electrode 34. The IGBT is formed in the active region 20 by these electrodes and semiconductor regions that are described above.

A deep p-type region 52, a RESURF region 56, and an end portion n-type region 62 are formed in the peripheral voltage-resistant region 50. The deep p-type region 52 is positioned at the boundary between the active region 20 and the peripheral voltage-resistant region 50. The deep p-type region 52 is formed in an area exposed on the upper surface of the semiconductor substrate 12. The deep p-type region 52 contacts the body region 26. The deep p-type region 52 is formed deeper than the gate electrode 28 in the active region 20. The deep p-type region 52 contains a high concentration of p-type impurities, and is ohmically connected to an electrode 54 that is formed on the deep p-type region 52. The electrode 54 functions as an example of the metal layer.

The RESURF region 56 is adjacent to the deep p-type region 52. The RESURF region 56 is formed in an area exposed on the upper surface of the semiconductor substrate 12. The RESURF region 56 is formed shallower than the deep p-type region 52. The p-type impurity concentration of the RESURF region 56 is lower than that of the deep p-type region 52. Also, the p-type impurity concentration of the RESURF region 56 is lower than the n-type impurity concentration of the end portion n-type region 62. The end portion n-type region 62 is formed in an area exposed on the end surface 12a of the semiconductor substrate 12, and exposed on the upper surface of the semiconductor substrate 12. The end portion n-type region 62 has a relatively high concentration of n-type impurities, and is ohmically connected to an electrode 64 that is formed on the end portion n-type region 62. The electrode 64 functions as an example of the metal layer. The drift region 30 described above is formed on a lower side of the deep p-type region 52, the RESURF region 56, and the end portion n-type region 62. That is, the drift region 30 extends from the active region 20 to the peripheral voltage-resistant region 50. Also, the drift region 30 is also in the area between the RESURF region 56 and the end portion n-type region 62, and is exposed on the upper surface of the semiconductor substrate 12 in this area. Hereinafter, the drift region 30 between the RESURF region 56 and the end portion n-type region 62 will be referred to as a peripheral drift region 30a. The n-type impurity concentration of this drift region 30 is lower than the n-type impurity concentration of the end portion n-type region 62. The collector region 32 is formed on a lower side of the drift region 30 in the peripheral voltage-resistant region 50 as well.

An insulating film 58 is formed on the surface of the peripheral voltage-resistant region 50. The insulating film 53 extends from the deep p-type region 52 to the end portion n-type region 62, and is formed on the upper surface of both the RESURF region 56 and the peripheral drift region 30a. The electrode 54 and the electrode 64 are formed on the upper surface of the insulating film 58. The electrode 54 contacts the deep p-type region 52 via a through-hole formed in the insulating film 58. The electrode 54 and the electrode 64 in this example embodiment are made of aluminum, but the type of metal used to form the electrodes is not limited to this.

A polyimide film 70 is formed between the electrode 54 and the electrode 64, as well as between the emitter electrode 22 and the electrode 54. The polyimide film 70 between the electrode 54 and the electrode 64 is formed on an upper surface of the insulating film 58 so as to contact both a portion of one side surface of the electrode 54, and a portion of one side surface of the electrode 64. Meanwhile, the polyimide film 70 between the emitter electrode 22 and the electrode 54 is formed on an upper surface of an insulating film 57 so as to contact both a portion of one side surface of the electrode 22, and a portion of one side surface of the electrode 54. The polyimide film 70 functions as an example of the first passivation film. In this example embodiment, the first passivation film is formed by the polyimide film 70, but the material that forms the first passivation is not limited to this. Also, the polyimide film 70 may contact the entire side surface of the electrode 54 or 64. That is, the polyimide film 70 may contact the electrode 54 or 64 such so as to be at substantially the same height as the electrode 54 or 64.

A nitride film 76 is formed on an upper surface of the polyimide film 70, an upper surface of the electrode 54, and an upper surface of the electrode 64. That is the nitride film 76 is formed on the surface of the peripheral voltage-resistant region 50. The nitride film 76 is formed extending from the polyimide film 70 to the electrode 54 and the electrode 64, as one continuous film. The nitride film 76 functions as an example of the second passivation film. The nitride film 76 may be a semiconductive silicon nitride film so-called SInSiN film), for example, but the material that forms the second passivation film is not limited to this.

The structure described above, in other words, the electrode 54, contacts the polyimide film 70 and the nitride film 76. The linen expansion coefficients of the electrode 54 (aluminum), the polyimide film 70 (polyimide), and the nitride film 76 (SiN) are $24 \times 10^{-6}$ [/K], $40 \times 10^{-6}$ [/K], and $3 \times 10^{-6}$ [/K], respectively. Therefore, the following relationship among these three is true. That is, the linear expansion coefficient of the electrode 54 is greater than the linear expansion coefficient of the nitride film 76. Also, the linear expansion coefficient of the polyimide film 70 is greater than the linear expansion coefficient of the nitride film 76. Further, the linear expansion coefficient of the polyimide film 70 is greater than the linear expansion coefficient of the electrode 54.

A polymer layer 80 is formed on an upper surface of the nitride film 76. This polymer layer 80 also contacts a portion of the upper surface of the emitter electrode 22. That is, the polymer layer 80 is formed as a layer that is continuous with a portion of the surface of the active region 20, and the surface of the peripheral voltage-resistant region 50. The polymer layer 80 of this example embodiment is formed of a polyamide, but the material that forms the polymer layer 80 is not limited to this. A resin layer 82 is formed on an upper surface of the polymer layer 80. Forming the polymer layer 80 of a polyamide enables the contact between a metal plate (e.g., the bus bar described above), not shown, and the resin layer 82 to be improved.

Figure 2:
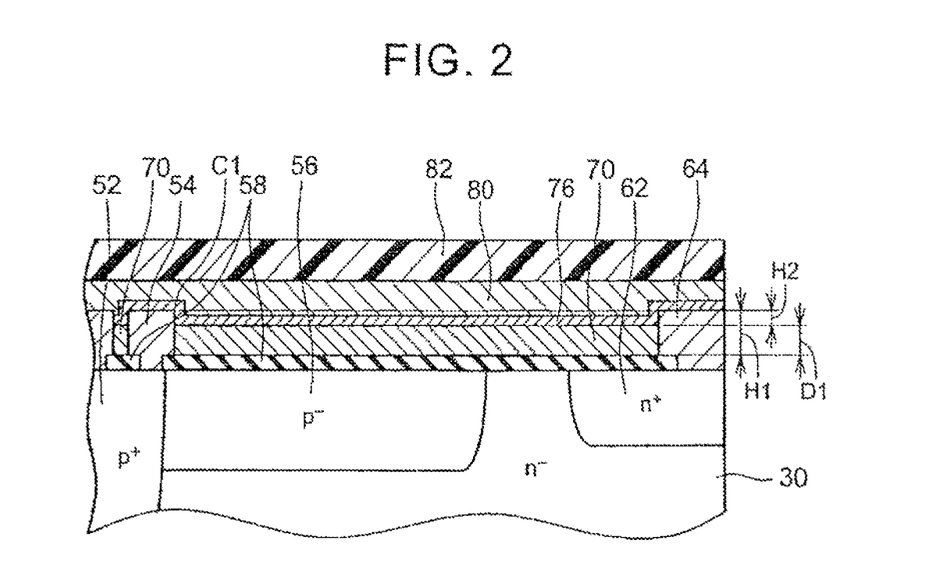
FIG. 2 is a partial enlarged view of a longitudinal sectional view of a peripheral voltage-resistant region of the semiconductor device of the invention.
Figure 3:
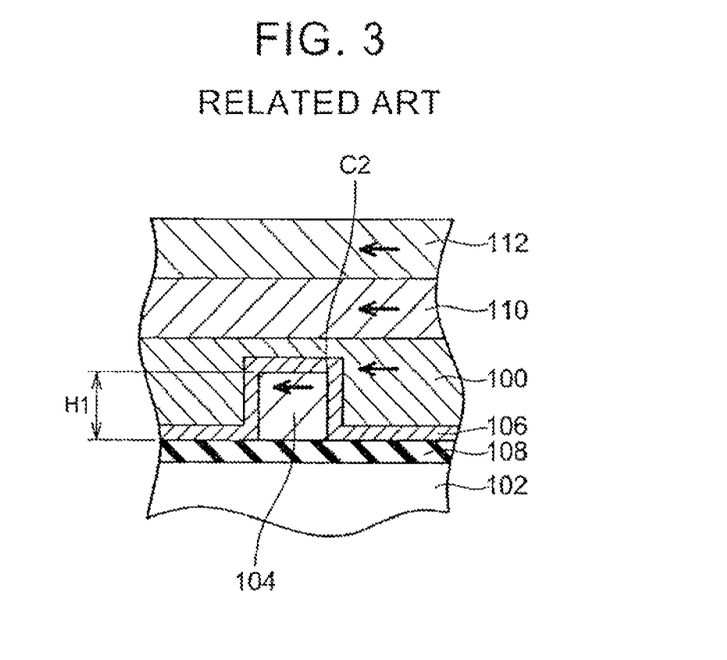
FIG. 3 is a longitudinal sectional view of an area near an electrode of a related semiconductor device at a low temperature.
Figure 4:
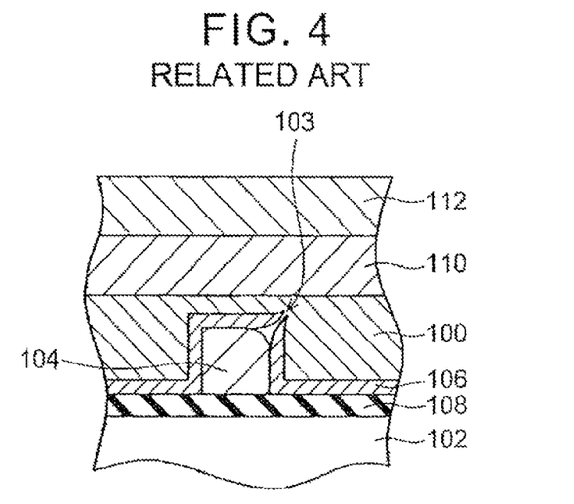
FIG. 4 is a view of a state in which a crack has formed in a passivation film of the semiconductor device in FIG. 3.

Next, the details of the semiconductor device 10 of this example embodiment will be described referring to a semiconductor device according to related art as a comparative example, with reference to FIGS. 2 to 6. FIG. 3 is a longitudinal sectional view of an area near an electrode of the related semiconductor device at a low temperature. The arrows in FIG. 3 indicate, in frame format, stress generated in each member from the low temperature. An electrode 104, a nitride film 106, a polyimide film 100, a polymer layer 110, and a resin layer 112 are made of the same materials that the electrode 54, the nitride film 76, the polyimide film 70, the polymer layer 80, and the resin layer 82 in FIG. 2 are made of, respectively. The linear expansion coefficients of the electrode 104 (aluminum), the nitride film 106, the polyimide film 100, the polymer layer 110 (polyamide), and the resin layer 112 are approximately $24 \times 10^{-6}$ [/K], $3 \times 10^{-6}$ [/K], $40 \times 10^{-6}$ [/K], and $9 \times 10^{-6}$ [/K], in respectively. That is, the nitride film 106 is surrounded by material having a comparatively larger linear expansion coefficient than the linear expansion coefficient of the nitride film 106 itself. Therefore, when these materials are thermally expanded and thermally contracted repeatedly due to changes in temperature, a strong thermal stress such as that indicated by the arrows in FIG. 3 acts on the nitride film 106, such that a crack 103 like that shown in FIG. 4 forms. Shear stress and compression stress are examples of thermal stress, but the thermal stress is not limited to these. The thermal stress described above concentrates particularly at a corner portion of the step (e.g., corner portion C2 in FIG. 3), so the crack 103 forms near the corner portion of the nitride film 106. Typically, stress concentrates more at the nitride film 106, and thus the thermal stress that acts on the corner portion of the nitride film 106 increases, the higher the step of the electrode 104 is (i.e., the thicker the electrode 104 is).

Here, FIG. 2 is a partial expanded view of the peripheral voltage-resistant region 50 of the semiconductor device 10 in FIG. 1. As shown in FIG. 2, the polyimide film 70 contacts a portion of both side surfaces of the electrode 54, and a portion of one side surface of the electrode 64. Therefore, the electrode 54 protrudes by height H2 from the suffice of the film adjacent to the electrode 54 (i.e., from the polyimide film 70). On the other band, with the related semiconductor device shown in FIG. 3, the electrode 104 is formed on the upper surface of an insulating film 108. Therefore, the electrode 104 protrudes by a height H1 from the surface of the insulating flint 108. If the electrode 54 and the electrode 104 are formed at the same height (i.e., height H1) front the surface of the insulating film, the height 112 at which the electrode 54 protrudes is smaller, by a film thickness D1 of the polyimide film 70, than the height H1 at which the electrode 104 protrudes. Therefore, the step of the nitride film 76 at the corner portion C1 of the electrode 54 will not be as large as the step of the nitride film 106 at the corner portion C2 of the electrode 104. As a result, even if the same thermal stress acts on the nitride film 76 from the electrode 54 and the polymer layer 80 and the like following a change in temperature, the concentration of stress from the moment toward the corner portion C1 will be alleviated. Therefore, the occurrence of cracking in the nitride film 76 is able to be reduced.

Figure 5:
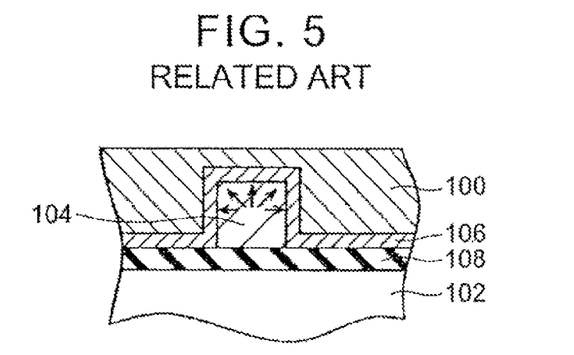
FIG. 5 is a longitudinal sectional view of an area near an electrode of the related semiconductor device at a high temperature.

FIG. 5 is a longitudinal sectional view of the area near an electrode of the related semiconductor device at a high temperature. An example of when the temperature is high is when a polyimide baking process is being performed in the manufacturing process of the semiconductor device, for example.

Figure 6:
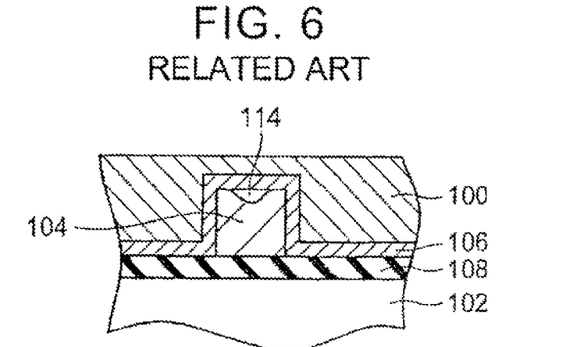
FIG. 6 is a view of a state in which a void has formed in a passivation film of the semiconductor device in FIG. 5.

As shown in FIG. 5, the electrode 104 (aluminum) is covered by the nitride film 106 and the insulating film 108 (SiO$_2$). The linear expansion coefficients of the aluminum, the nitride film (SiN), and the SiO$_2$ are 24×10$^{-6}$ [/K], 3×10$^{-6}$ [/K], and 0.6×10$^{-6}$ [/K], respectively. When the semiconductor device is heated to a high temperature in the polyimide baking process, the electrode 104 that is made of aluminum that has a comparatively large linear expansion coefficient is surrounded by the nitride film 106 and the insulating film 108 that have comparatively small linear expansion coefficients, so expansion of the electrode 104 is impeded. Therefore, the electrode 104 plastic deforms inside the nitride film 106 and the insulating film 108, and the crystal density of the electrode 104 increases. Then when the semiconductor device returns to normal temperature, the electrode 104 in which the crystal density had temporarily increased thermally contracts until it is smaller than it was originally (i.e., until it is than the size of the electrode 104 before being heated). That is, the volume of the electrode 104 is reduced by the crystal density of the electrode 104 having increased. When this happens, a vacuum cavity (void) is formed inside the nitride film 106 and the insulating film 108, as shown in FIG. 6. Meanwhile, with the semiconductor device 10 of the example embodiment, a structure is used in which the electrode 54 not only contacts the nitride film 76 and the insulating film 58, but also contacts the polyimide film 70, as shown in FIG. 2. As described above, the linear expansion coefficient (40×10$^{-6}$ [/K]) of the polyimide film 70 is larger than the linear expansion coefficient (3×10$^{-6}$ [/K]) of the nitride film 76. Therefore, when the semiconductor device is heated, the electrode 54 expands relatively easily at the surface contacting the polyimide film 70. As a result, a void is able to be inhibited from forming due to heating.

Also, the nitride film prevents movable ions such as Na, Cu, and Cl from entering the semiconductor substrate 12 from the outside. Therefore, as shown in FIG. 1, movable ions are able to be pre-vented from entering the RESURF region 56 because the nitride film 76 is formed between the electrode 54 and the electrode 64 in the peripheral voltage-resistant region 50. Also, because the nitride film 75 is semiconductive, an induced charge is able to be inhibited from being produced in the surface of the semiconductor substrate 12 by forming the nitride film 76 extending between the electrode 54 and the electrode 64. Therefore, it is possible to suppress a decrease in the voltage-resistance in the peripheral voltage-resistant region.

As described above, with the related semiconductor device described above, stress concentrates at a corner portion of the protruding electrode 104 due to a change in temperature, so a crack forms in the nitride film 106 that covers the corner portion. That is, when the nitride film 106 is formed covering a step, stress concentrates at the corner portion of the step due to a change in temperature, and a crack forms in the nitride film 106 that coven this corner portion. In particular, when the step is large when the thickness of the electrode is large), the nitride film 106 tends to crack easily. On the other hand, with the structure of the semiconductor device 10 according to the invention, the polyimide film 70 is formed adjacent to at least a portion of the side surface of the electrodes 54 and 64. Therefore, the steps of the electrodes 54 and 64 that protrude from the polyimide film 70 are smaller than they are in the related semiconductor device. That is, the thickness of the electrodes 54 and 64 is relatively smaller by the thickness of the polyimide film 70. Therefore, the concentration of stress at corner portions of the electrodes 54 and 64 due to a change in temperature is reduced or prevented, so the formation of cracks in the nitride film 76 that covers the corner portions of the electrodes 54 and 64 is able to be inhibited. Further, the nitride film 76 is formed on the polyimide film 70 that contacts the side surfaces of the electrodes 54 and 64. Therefore, the polyimide film 70 is protected by the nitride film 76, and thus does not need to have the same function as the nitride film 76. Therefore, the polyimide film 70 is able to be made of material that allows for the expansion of the electrodes 54 and 64 when heated, compared with the nitride film 76. As a result, an increase in the crystal densities of the electrodes 54 and 64 when heated is able to be suppressed, so a void is able to be inhibited from forming. Thus, according to the semiconductor device 10 of this example embodiment, a void is able to be inhibited from forming around the electrodes, and cranks are able to be inhibited from forming in the nitride film 76.

(Manufacturing Method of the Semiconductor Device)

Next, a manufacturing method of the semiconductor device 10 will be described with reference to FIGS. 7 to 12. Although not shown, a semiconductor element structure such as a diffusion layer is formed in the active region 20 of the semiconductor substrate 12. The semiconductor element structure of the active region 20 is formed by a related well-known method, so a description of this forming method will be omitted. In the description below, a method for forming a protective film that is provided on the surface of the peripheral voltage-resistant region 50 of the semiconductor substrate 12 will mainly be described. Also, in the drawings referred to below, only the area neat the electrode 54 is shown, but the manufacturing method described below is also the same for the peripheral voltage-resistant region 50. In this example embodiment, the semiconductor device 10 is manufactured by performing on insulating film forming step, a metal layer forming step, a first passivation film forming step, and a second passivation film forming step, on the semiconductor substrate 12.

Figure 7:
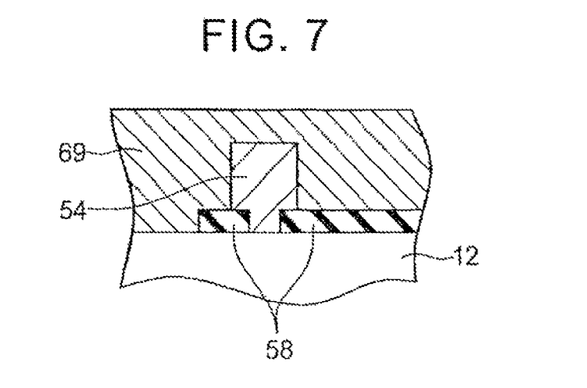
FIG. 7 is a view of a state in which a polyimide has been applied onto an electrode and an insulating film, in a semiconductor device manufacturing method of the invention.

First, as shown in FIG. 7, an insulating film is formed on the surface of the semiconductor substrate 12 according to a well-known method. Then etching is applied to the insulating film using a photolithography technique or the like to form the patterned insulating film 58.

Next, as shown in FIG. 7, an aluminum layer is formed by a CVD method or the like on the surface of both the insulating film 58 and the semiconductor substrate 12. A barrier layer may also be formed beforehand between the aluminum layer and the insulating film 58, and between the aluminum layer and the semiconductor substrate 12. Then, etching is applied to the aluminum layer using a photolithography technique or the like, and the electrode 54 is formed. The electrode 64, not shown, is formed by the same method as the electrode 54.

Figure 8:
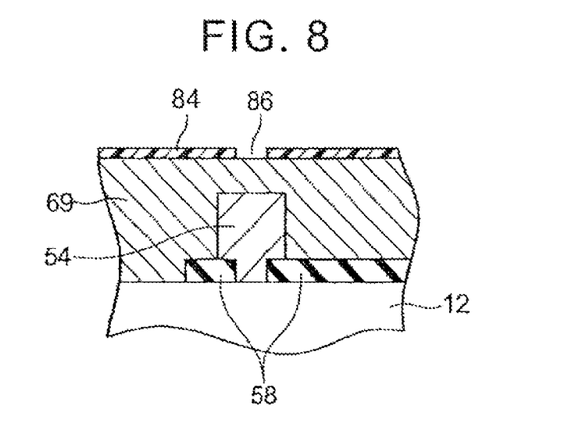
FIG. 8 is a view of a state in which a mask has been formed on the applied polyimide film, in the semiconductor device manufacturing method of the invention.

Continuing on, as shown in FIG. 7, an organic solvent containing polyimide is applied by a method such as spin coating to the surface of the peripheral voltage-resistant region 50 of the semiconductor substrate 12, and then dried to form a polyimide coating film 69. In this case, the polyimide coating film 69 is formed higher than the height of the electrode 54 such that the step between the electrode 54 and the insulating film 58 will be filled (i.e., eliminated). Next, as shown in FIG. 8, a patterned mask 84 is formed on the polyimide coating film 69 using a photolithography technique. This patterned mask 84 has an opening 86 above the electrode 54. As shown in FIG. 8, a width of the opening 86 is narrower than a width of the electrode 54.

Figure 9:
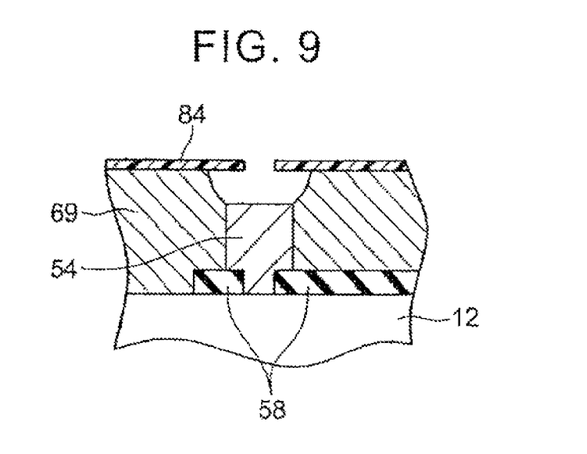
FIG. 9 is a view of a state in which the polyimide film has been etched via the mask, in the semiconductor device manufacturing method of the invention.
Figure 10:
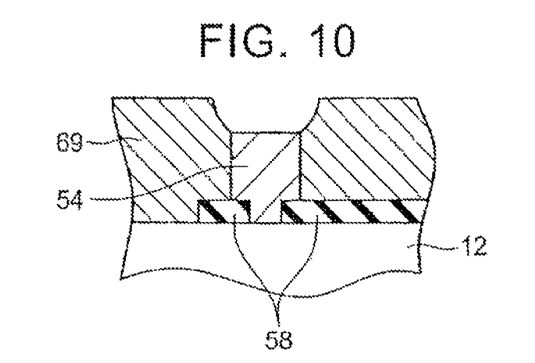
FIG. 10 is a view of a state in which the mask has been removed (of a state before the polyimide film is baked), in the semiconductor device manufacturing method of the invention.
Figure 11:
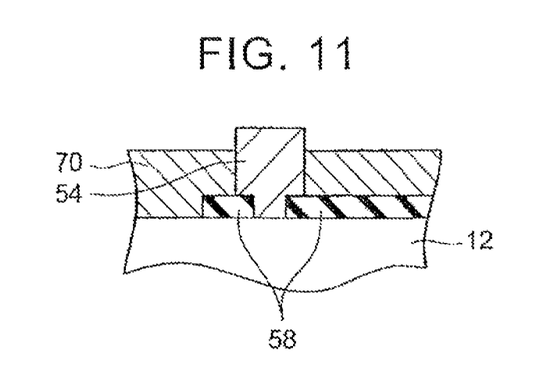
FIG. 11 is a view of a state alter the polyimide film has been baked by heat treating the semiconductor substrate, in the semiconductor device manufacturing method of the invention.

Next, as shown in FIG. 9, the polyimide coating film 69 that is on the upper portion of the electrode 54 is removed by wet etching. Using wet etching enables an area of the polyimide coating film 69 that is wider than the opening 86 of the mask 84 to be removed. Then, as shown in FIG. 10, the mask 84 is broken down and removed by ashing. Then the polyimide coating film 69 is baked by applying a polyimide baking process. Polyimide contracts at a constant rate when heated at a predetermined temperature. Therefore, this polyimide baking process causes the polyimide coating film 69 to thermally contract such that it becomes the polyimide film 70 like that shown in FIG. 11. In the state shown in FIG. 11, the upper surface of the polyimide film 70 is slightly lower than the upper surface of the electrode 54. Also, the polyimide film 70 contacts portion of both side surfaces of the electrode 54.

The height of the polyimide film 70 (i.e., the height from the insulating film 58) is able to be formed at an appropriate height by adjusting the height of the polyimide coating film 69 beforehand. In this example embodiment, the upper surface of the polyimide film 70 is formed lower than the upper surface of the electrode 54, but the height of the polyimide coating film 69 may also be adjusted to be substantially the same height as the electrode 54. Having the upper surface of the polyimide film 70 be substantially the same height as the upper surface of the electrode 54 enables the step formed in the nitride film 76 to be smaller.

Figure 12:
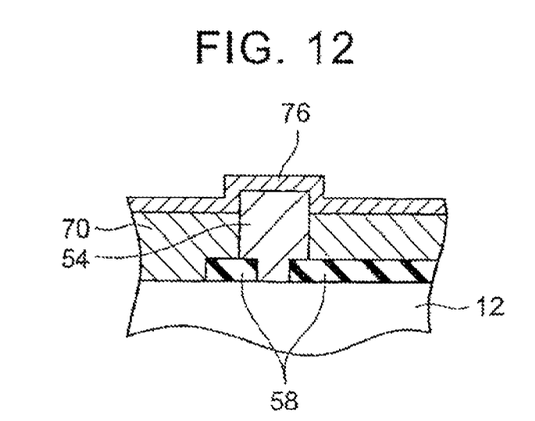
FIG. 12 is a view of a state in which a nitride film has been formed on the polyimide film, in the semiconductor device manufacturing method of the invention.

Next, as shown hr FIG. 12, the nitride film 76 is formed using a plasma CVD method or the like on the upper surface of both the polyimide film 70 and the electrode 54. The method for forming the nitride film 76 is not limited to the plasma CVD method. For example, a radical beam method or the like may also be used. The nitride film 76 formed in this way is formed continuous from the polyimide film 70 to the electrode 54, and is in contact with the upper surface of the polyimide film 70 and the upper surface of the electrode 54.

According to the manufacturing method described above, the semiconductor device 10 of the example embodiment shown in FIGS. 1 and 2 is able to be manufactured.

With the manufacturing method of this example embodiment, after forming the electrode 54 and the electrode 64 that are made of aluminum, the nitride film 76 is formed, so the electrodes 54 and 64 will not corrode. Also dry etching is used so the accumulation rate is greater than it is with wet etching. That is, when the aluminum film is formed after forming the nitride film, and then dry etching is applied, hydrogen from the nitride film reacts with the chlorine of the etching gas, so there is a possibility that the aluminum will corrode. However, with the manufacturing method of this example embodiment, the nitride film is formed after farming the aluminum film, so there will be no problem with corrosion of the aluminum film described above.

Hereinafter, example embodiments of the technology described in this specification have been described in detail, but these are no more than examples. The semiconductor device and semiconductor device manufacturing method described in this specification also include various modifications of the example embodiments described above.

For example, in the example embodiment, the nitride film 76 is formed by a semiconductive silicon nitride film (SInSiN film), but the nitride film 76 may also be a two-layered structure having a silicon nitride film (SiN) on an upper surface of a semiconductive silicon nitride film (SInSiN film). In this case, the silicon nitride film (SiN) that is the am of the upper layer of the nitride film 76 serves to insulate, as well as to inhibit movable ions from entering from the outside, while the semiconductive silicon nitride film (SInSiN film) that is the film of the lower layer of the nitride film 76 inhibits an induced charge from being produced in the substrate surface by using its semiconductive property. That is, movable ions from the outside are able to be reliably inhibited from entering the RESURF region 56 by this kind of passivation film being formed between the electrode 54 and the electrode 64 of the peripheral voltage-resistant region 50. As is evident from the function of the nitride film 76 described above, one end of the nitride film 76 may be connected to the electrode 54, and the other end of the nitride film 76 may be connected to the electrode 64. Therefore, the nitride film 76 does not need to be formed on the entire upper surface of the electrode 54. That is, the nitride film 76 may be formed only on a portion of the upper surface of the electrode 54. Similarly, the nitride film 76 does not need to be formed on the entire upper surface of the electrode 64. That is, the nitride film 76 may be formed only on a portion of the upper surface of the electrode 64.

Further, in the example embodiment, the electrode 54 and the electrode 64 are electrodes of the uppermost layer, but in a semiconductor device having a multilayer wiring structure, the structure according to the invention may be formed on a layer other than the uppermost layer. Also, in the example embodiment, an IGBT is formed in the active region 20 of the semiconductor device 10, but another semiconductor element may also be formed in the active region 20. For example, a MOSFET or a diode or the like may also be formed. Further, in the example embodiment, the RESURF region 56 is formed in the peripheral voltage-resistant region 50, but the peripheral voltage-resistant region formed on the semiconductor substrate is not limited, to the RESURF region 56. For example, another structure such as an FLR (Field Limiting Ring) structure or a field plate structure, or an EQR (Equipotential Ring) or the like may be formed instead of the RESURF region 56.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor device manufacturing method comprising:
    forming a metal layer above a semiconductor substrate;
    forming a first passivation film that contacts a top surface of the metal layer and at least a portion of one side surface of the metal layer;
    removing a first portion of the first passivation film that is on the top surface of the metal layer such that the top surface of the metal layer is exposed;
    baking the first passivation film such that (i) an upper surface of the first passivation film becomes lower than the top surface of the metal layer, and (ii) a second portion of the first passivation film is in contact with the one side surface of the metal layer; and
    after baking the first passivation film, forming a second passivation film extending from the first passivation film to the metal layer, the second passivation film contacting the upper surface of the first passivation film and at least a portion of the upper surface of the metal layer,
    wherein a linear expansion coefficient of the metal layer is greater than a linear expansion coefficient of the second passivation film, and a linear expansion coefficient of the first passivation film is greater than the linear expansion coefficient of the second passivation film.

2. The method according to claim 1, wherein the first passivation film includes a polyimide.

3. The method according to claim 1, wherein the second passivation film is semiconductive.

4. The method according to claim 1, further comprising forming a peripheral voltage-resistant region at an outer peripheral portion of the semiconductor substrate, wherein the second passivation film is positioned in the peripheral voltage-resistant region.

5. The method according to claim 1, wherein the second passivation film is a two-layered structure.

6. The method according to claim 1, wherein the first passivation film has a thickness in a first direction that is greater than a height of a portion of the second passivation film that contacts the portion of the upper surface of the metal layer.

* * * * *